United States Patent
Fifield et al.

(10) Patent No.: US 6,753,590 B2
(45) Date of Patent: Jun. 22, 2004

(54) HIGH IMPEDANCE ANTIFUSE

(75) Inventors: John A. Fifield, Underhill, VT (US); Russell J. Houghton, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,375

(22) Filed: Jul. 8, 2002

(65) Prior Publication Data

US 2004/0004269 A1 Jan. 8, 2004

(51) Int. Cl.[7] .................. H01L 29/00; H01L 29/76; H01L 21/326
(52) U.S. Cl. .................. 257/529; 257/50; 257/173; 257/387; 257/530; 257/665; 438/131; 438/467; 438/600; 438/957; 365/96; 365/225.7
(58) Field of Search .................. 257/50, 173, 387, 257/529, 530, 665; 438/131, 467, 600, 957; 365/96, 225.7

(56) References Cited

U.S. PATENT DOCUMENTS

| | | | |
|---|---|---|---|
| 5,242,851 A | | 9/1993 | Choi |
| 5,557,136 A | | 9/1996 | Gordon et al. |
| 5,656,534 A | * | 8/1997 | Chen et al. .................. 438/600 |
| 5,909,049 A | | 6/1999 | McCollum |
| 6,020,777 A | | 2/2000 | Bracchitta et al. |
| 6,051,851 A | | 4/2000 | Ohmi et al. |
| RE36,893 E | | 10/2000 | Pramanik et al. |
| 6,130,469 A | * | 10/2000 | Bracchitta et al. .......... 257/530 |
| 6,140,692 A | | 10/2000 | Sher et al. |
| 6,240,033 B1 | | 5/2001 | Yang et al. |

* cited by examiner

Primary Examiner—Donghee Kang
(74) Attorney, Agent, or Firm—Robert A. Walsh

(57) ABSTRACT

A programmable element that has a first diode having an electrode and a first insulator disposed between the substrate and said electrode of said first device, said first insulator having a first value of a given characteristic, and an FET having an electrode and a second insulator disposed between the substrate and said electrode of said second device, said second insulator having a second value of said given characteristic that is different from said first value. The electrodes of the diode and the FET are coupled to one another, and a source of programming energy is coupled to the diode to cause it to permanently decrease in resistivity when programmed. The programmed state of the diode is indicated by a current in the FET, which is read by a sense latch. Thus a small resistance change in the diode translates to a large signal gain/change in the latch. This allows the diode to be programmed at lower voltages.

17 Claims, 9 Drawing Sheets

HIGH IMPEDANCE ANTIFUSE

BACKGROUND OF THE INVENTION

1. Technical Field

The invention relates generally to semiconductor integrated circuits, and more particularly to antifuse elements.

2. Background Art

In the field of semiconductor integrated circuits, it is generally known to construct fuse elements that can be programmed (either optically or electrically) to provide an electrical open circuit in a link that normally provides a conductive path when activated. Such elements are used for example to set a sequence of address bits for a redundant line of memory cells, or to set product information that is subsequently read when a system is first powered up.

It is also known to provide an "antifuse," which is a programmable element that provides a selective short circuit. This is typically done by providing a stimulus that decreases the resistance of a programmed element. See for example U.S. Pat. No. 5,242,851, "Programmable Interconnect Device and Method of Manufacturing Same," which teaches the use of a line of intrinsic polysilicon that decreases in resistance from 10 G ohms to 500 to 100 ohms when programmed. In U.S. Pat. No. 5,557,136, "Programmable Interconnect Structures and Programmable Integrated Circuits," two titanium-tungsten layers are separated by amorphous silicon, which breaks down during programming to form a conductive filament where it is thinned. Selective silicide formation as an antifuse is taught in U.S. Pat. No. 6,051,851, "Semiconductor Devices utilizing Silicide Reaction." Conductor-filled vias as a programming element are taught in Re. No. 36,893, "Anti-Fuse Structure For Reducing Contamination of the Anti-Fuse Material."

A particular type of antifuse that has been used more recently is the "insulator antifuse," in which reliance is placed on dielectric breakdown of an insulator between conductors to provide the decreased resistance. U.S. Pat. No. 5,909,049, "Antifuse Programmed PROM Cell," discloses a composite insulator of oxide, oxide-nitride, oxide (or O—N—O) that breaks down at an applied voltage of 10–18 volts to program the cell by melting the silicon below the insulator. U.S. Pat. No. 6,020,777, "Electrically Programmable Antifuse Circuit," teaches a MOS capacitor that is programmed by Fowler-Nordheim tunneling current when the applied voltage is 2× Vdd.

All of the above teachings rely on high programming voltages or currents to substantially alter the physical or electrical properties of the programmed element. With increasing device integration, applying these high stresses to elements to be programmed increases the possibilities of damaging non-programmed circuit elements. For example, a programming voltage of 18 volts will impart electrical fields that will damage other integrated circuit elements in adjacent circuits. At the same time, it is important for the antifuse to undergo a large resistance change so that it can be reliably sensed.

Accordingly, a need has developed in the art for antifuses that can be programmed at lower applied programming energies, while still creating an indication of its programmed state.

BRIEF SUMMARY OF THE INVENTION

It is thus an object of the present invention to provide antifuses that can be programmed at voltages and currents that reduce the possibility of damaging non-programmed circuit elements.

It is another aspect of the invention to provide antifuses that can be programmed at such lower applied energies while still being reliably sensed.

In a first aspect, the invention is a programmable element that has a first device having a first electrode and a first insulator disposed between the substrate and said electrode, said first insulator having a first value of a given parameter, and a second device having a second electrode and a second insulator disposed between the substrate and said second electrode, said second insulator having a second value of said given parameter that is different from said first value. The first and second electrodes are coupled to one another, and a source of programming energy is coupled to the first device to cause it to permanently decrease in resistivity when programmed. The programmed state of the first device is indicated by a conductive state of the second device.

In a third aspect, the invention is a method of forming an integrated circuit including a programmable element, comprising the steps of forming a first device on a substrate having a first electrode and a first insulator disposed between the substrate and said first electrode, the first insulator having a first value of a given parameter; forming a second device on a substrate having a second electrode and a second insulator disposed between the substrate and the second electrode, the second insulator having a second value of the given parameter that is different from the first value; coupling the first and second electrodes to one another; and coupling a source of programming energy to the first device.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE INVENTION

In the invention, the programming energy is decreased by making the fuse elements more susceptible to programming than the other devices on the chip. As such, the programming element can be programmed at the normal chip supply voltage (e.g., Vdd). The invention utilizes a latch that can sense small changes in resistance, such that the "result" of a large resistance change can be achieved without actually producing a large resistance change.

Figure 1A:
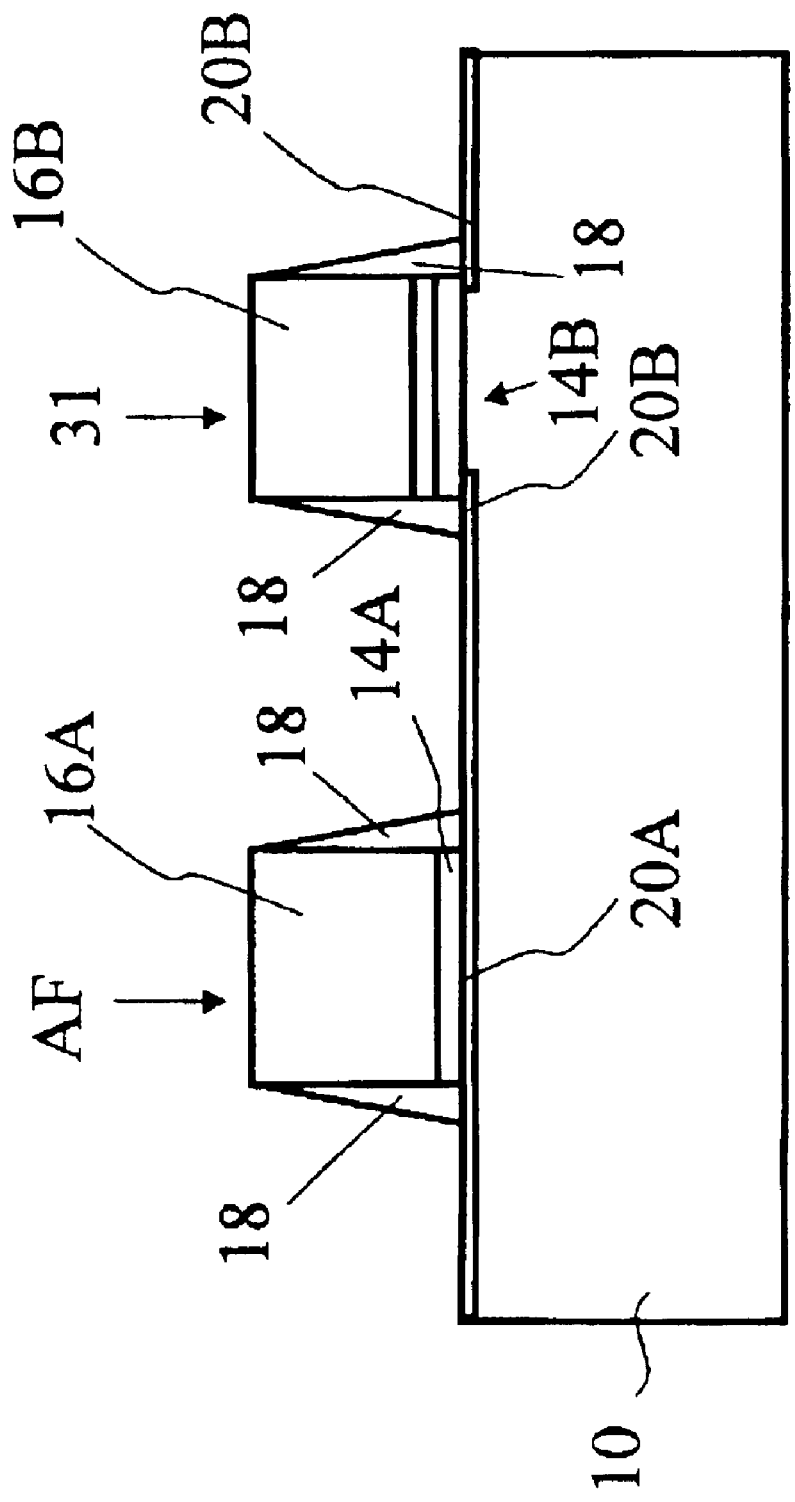
FIG. 1A is a cross-sectional view of the programmable element AF in accordance with a first embodiment of the invention.

FIG. 1A is a cross-sectional view of the programmable element AF of the invention, depicted alongside an FET 31. Isolation structures (not shown in FIG. 1A for ease of illustration) are formed in a substrate 10. Substrate 10 can be either a conventional bulk semiconductor substrate, or a silicon-on-insulator (SOI) substrate. As will be described in more detail below, the AF device has a dielectric 14A that is more susceptible to dielectric breakdown than the dielectric 14B of the FET. This differential is depicted schematically by different thicknesses; as described in more detail below, other techniques of producing this differential in breakdown voltage can be used. Both the antifuse AF and the FET 31 have gate electrodes 16A, 16B, respectively, and sidewall spacers 18. Note that a single diffusion region 20A extends beneath the antifuse AF, and extends towards the FET 31, where the diffusion region 20B provides the source/drain electrodes of FET 31.

In the invention the dielectric 14A is intentionally fabricated to have a lower breakdown voltage than a normal FET gate dielectric (14B). In practice, the differential in breakdown voltage should be such that upon application of a source voltage Vdd the dielectric 14A breaks down without dielectric 14B breaking down. This result can be achieved in several ways. One way is by thickness; the dielectric 14A is thinner (15–25 angstroms in thickness, in a 0.13 micron CMOS technology) than the dielectric 14B (30–50 angstroms in thickness, in that same technology). These measurements are given in terms of a technology generation for the simple reason that as technologies scale below 0.13 microns, gate dielectrics will become even thinner; in general the 2:1 ratio in respective thicknesses should be maintained, although that differential may decrease with decreasing channel lengths. A feature of the invention is its scalability; because the devices are programmed at the supply voltage, they scale with supply voltage and hence scale with the technology.

In addition to varying the respective thicknesses of the dielectrics, this differential in breakdown voltage can be achieved by implanting the "weaker" dielectric with ions (such as cesium) that physically damage the film to make it less dense, so as to make it more susceptible to breakdown. Another way would be to implant the dielectric with conductive ions to reduce its insulative value. Or multiple implants could be carried out to achieve both physical damage and conductivity increase. Yet another way would be to provide dopant regions above and/below the dielectric. For example, heavy N+ ions placed above and/or below the dielectric will enhance the programming field to reduce its insulative value.

Of these, the option of introducing a variable thickness is most attractive and is thus preferred, simply because it can be best controlled and reproduced in a volume manufacturing environment.

Figure 1B:
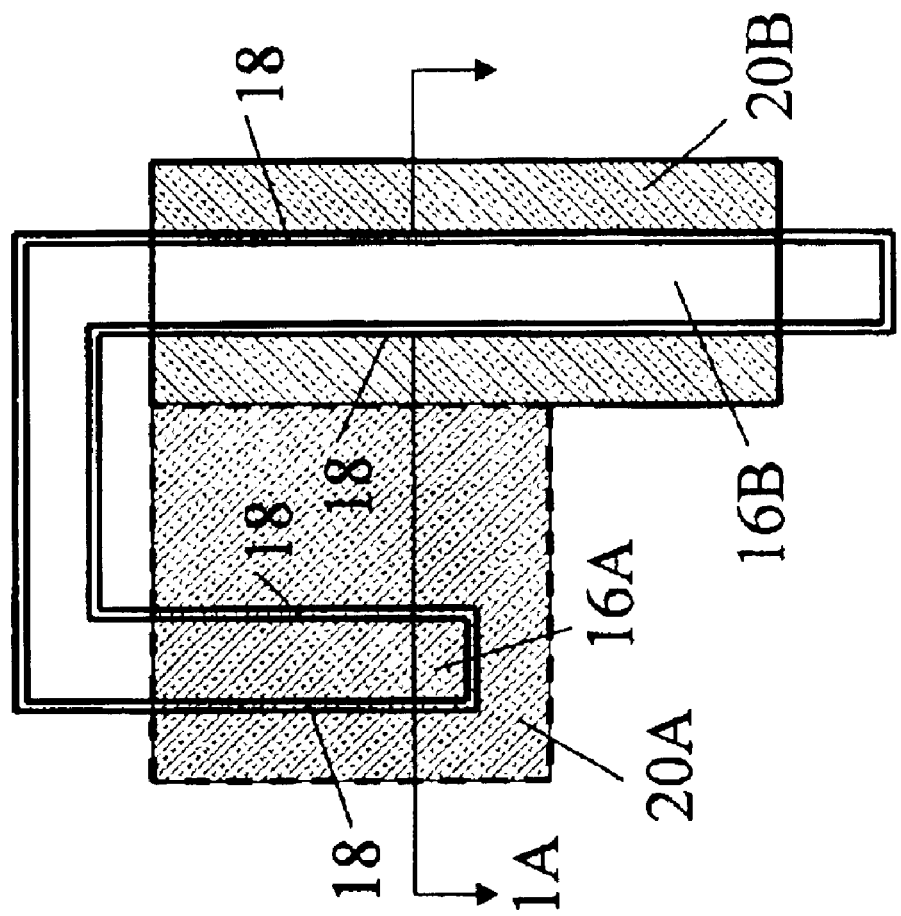
FIG. 1B is a top view of FIG. 1A, in accordance with a first embodiment of the invention.
Figure 1C:
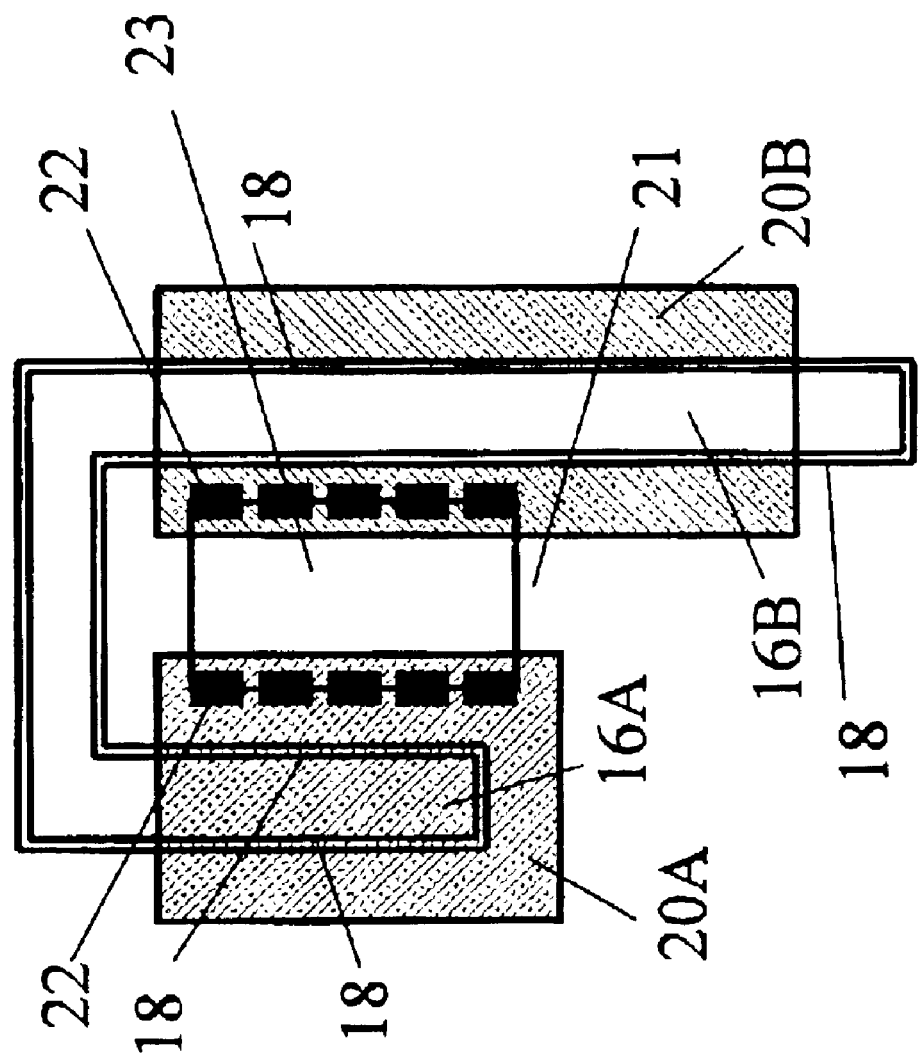
FIG. 1C is a top view of FIG. 1A, in accordance with a second embodiment of the invention.
Figure 2:
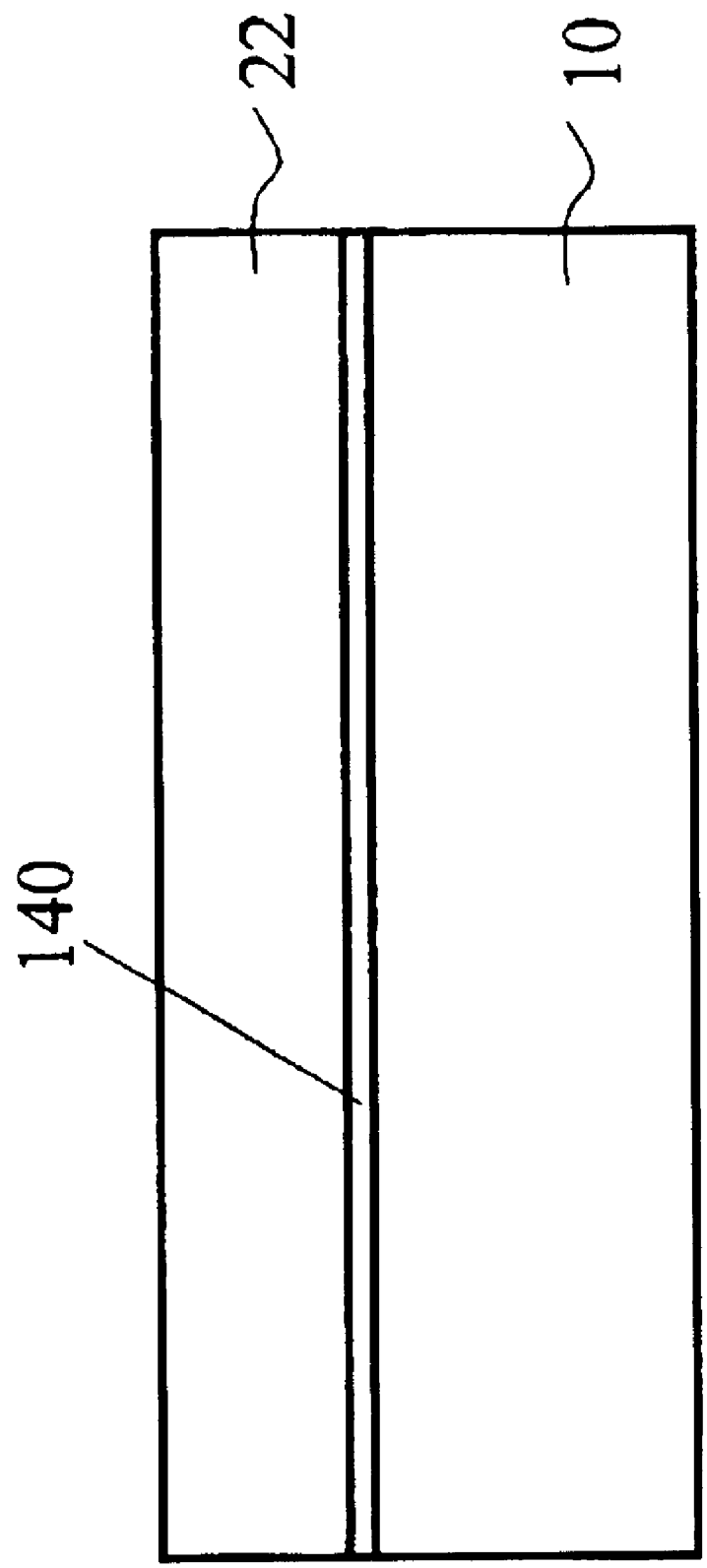
FIGS. 2, 3A, 3B, and 4 are sequential cross-sectional views of a substrate undergoing a method of forming the programmable element AF in accordance with a preferred embodiment of the invention.

An embodiment for manufacturing the antifuse of the invention will now be described with reference to FIGS. 2–4, which are sequential cross-sectional views of a substrate undergoing the method of the invention. In FIGS. 2–4, like reference numerals depict the same elements as those of FIG. 1. In FIG. 2, a dielectric layer 140 is formed on the substrate 10. Layer 140 can be silicon oxide, silicon nitride, silicon oxynitride, multiple layers of one or more of these materials, or other material suitable to serve as a dielectric for the gate electrode of an FET. Moreover, the layer can be formed by growth or deposition (e.g. CVD of oxide in a nitrogen ambient). In the invention, silicon oxide is preferred, formed by thermal growth. Then, a thick layer of silicon nitride 22 (or other material that can be removed selectively to dielectric 140) is coated on the structure.

Figure 3A:
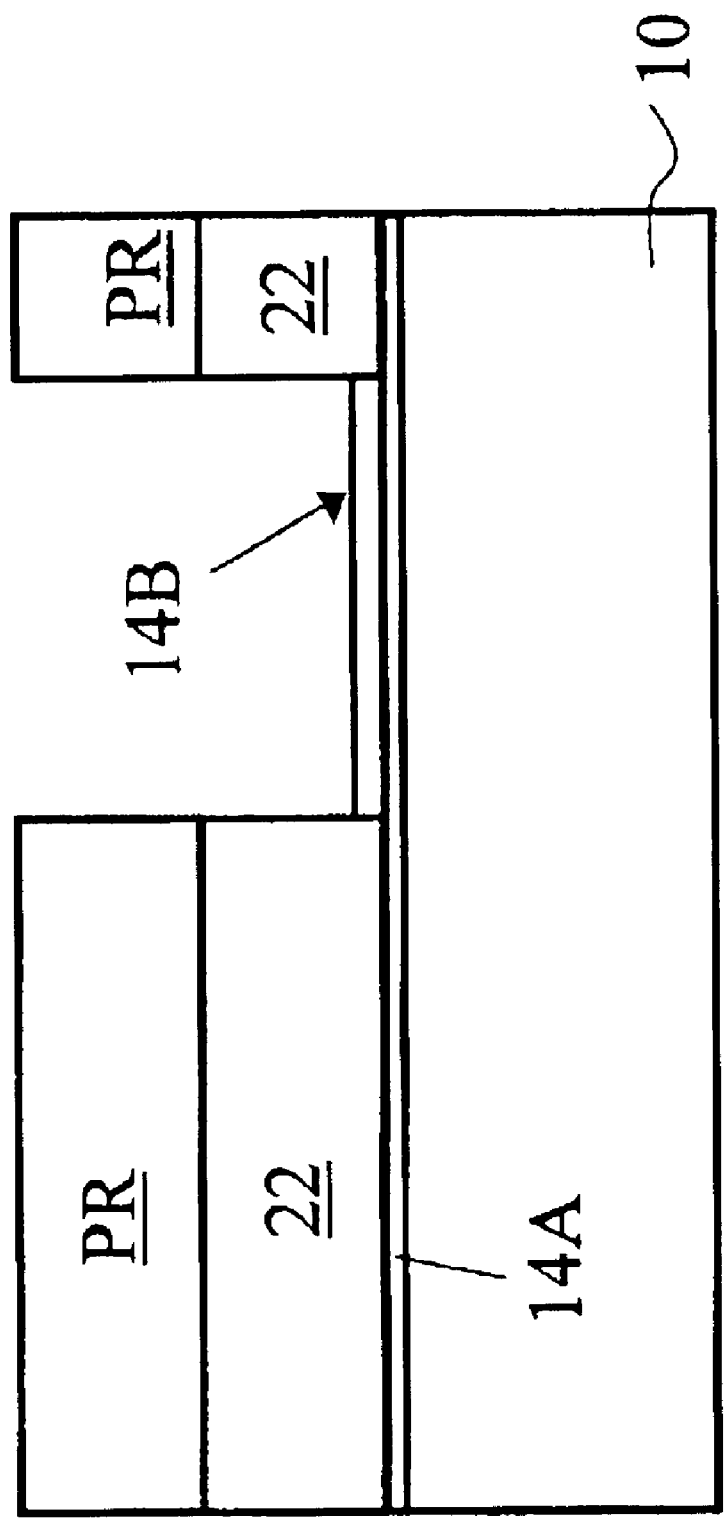
Figure 4:
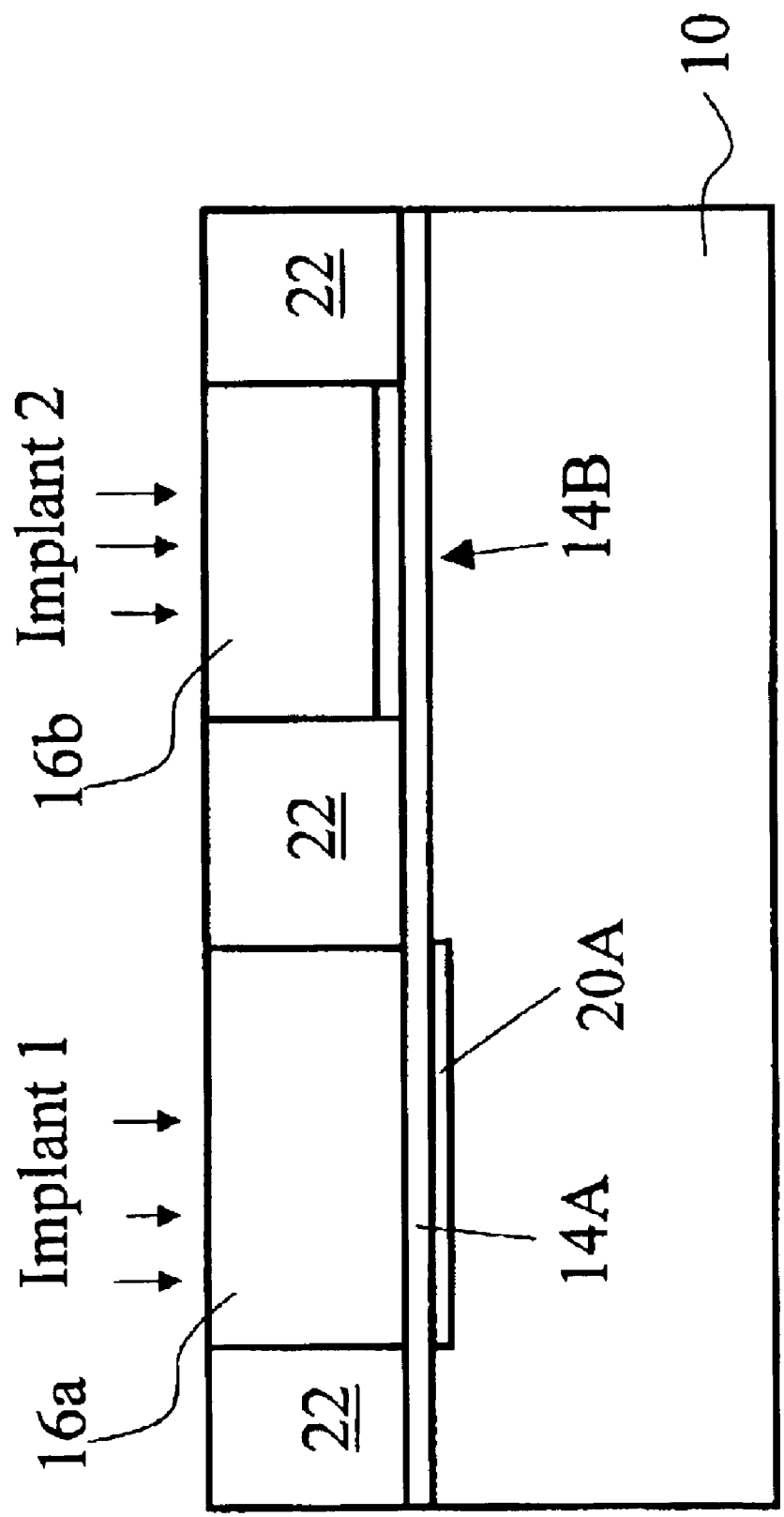

In a first alternate embodiment of the method of the invention, as shown in FIG. 3A, a photoresist PR is then applied to the nitride 22, and the nitride 22 is removed down to the underlying dielectric 140. In this alternative, the dielectric 140 that was first grown was the thin oxide 14A (approximately 15 to 25 angstroms in a 0.13 CMOS technology). The opening shown in FIG. 3A is provided in areas where the thicker silicon oxide 14B is to be formed, in this case by growing additional oxide of 15–25 angstroms in thickness.

Figure 3B:
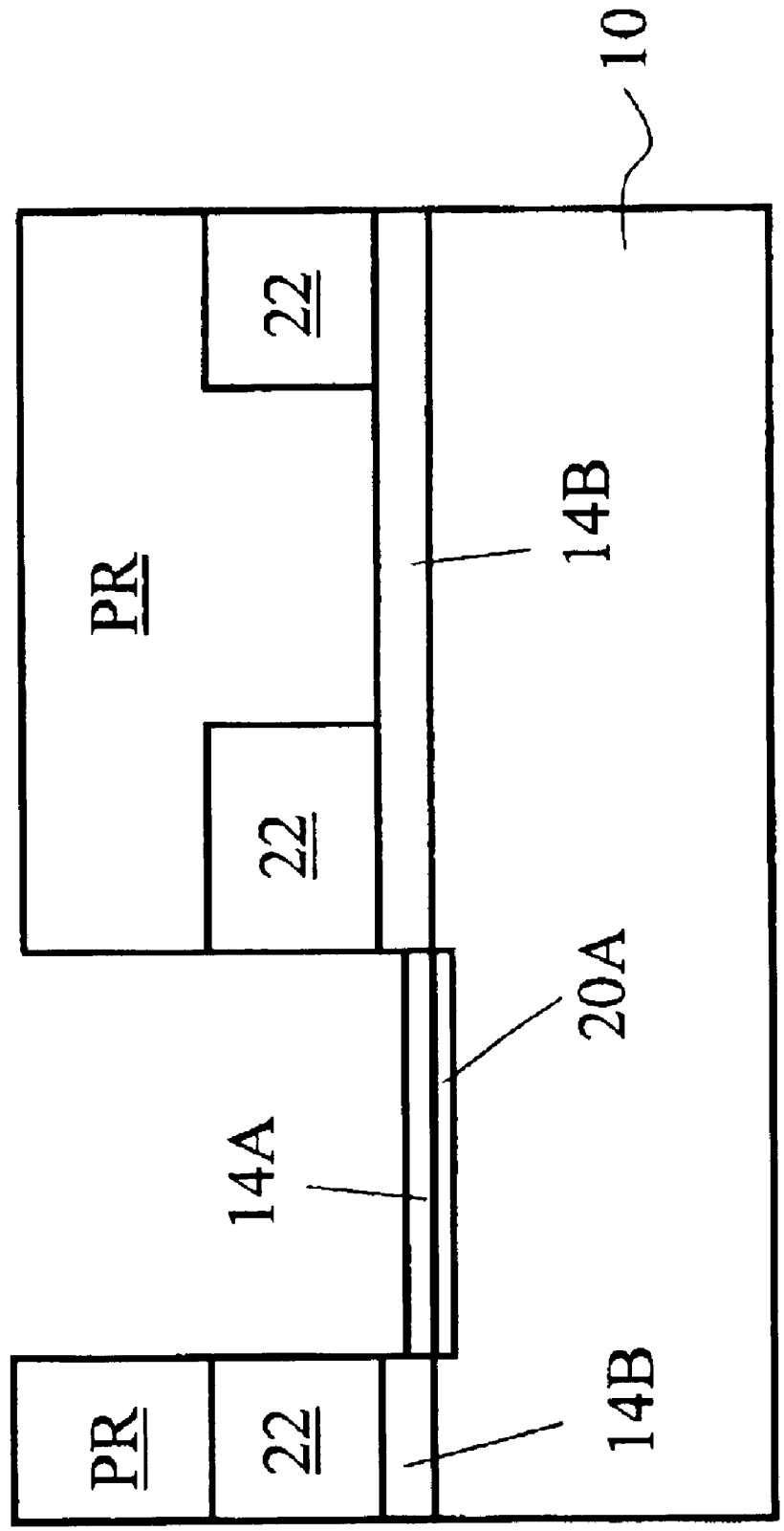

In a second alternate embodiment of the method of the invention, as shown in FIG. 3B, the dielectric 140 that is first grown is the thicker oxide 14B. The photoresist PR exposes areas where the thinner oxide 14A is to be formed, and after removal of exposed portions of layer 22 dielectric 14A is formed by etching the thicker oxide. This latter approach is more conducive to some of the other options (ion damage, incorporating a conductor impurity) previously described for introducing a differential in dielectric breakdown voltage between the two dielectrics. For example, either prior to or after completion of this etch process, a first portion of implant 20A is performed under 14A in the silicon area so as to increase the electric field under the fuse. This is also shown in FIG. 1B. In this embodiment, the electric field enhancement implant 20A, and any subsequent implants used to weaken 14A, would not require an additional masking step.

In addition to the techniques set forth above, by which oxidations are carried out under normal conditions such that the oxide for the different dielectrics grows at the same rate, this differential in thickness could be provided by carrying out an implants to either retard or enhance oxide growth rates. For example, by implanting a species such as nitrogen prior to gate oxidation, one can alter the oxide thickness in the implanted region to be by 20 to 70 percent thinner than a region not implanted with nitrogen. This is a direct result of retarding the oxidation growth rate. Or, one could enhance the oxidation rate of area 14B relative to 14A by using an oxygen implant in 14B (while masking 14A). Subsequent oxidation would result in a thicker oxide in region 14B relative to 14A.

Then as shown in FIG. 4, the photoresist is removed. If the first alternate embodiment is employed, and the field enhancement 20A or the weakening of the fuse oxide is desired, the following processes would be employed. A photoresist mask covers area 14B and exposes only area 14A, and an implant is carried out to form region 20A as shown in the Figs. This is then followed by removal of all photoresist, and forming a layer of polysilicon that is subsequently planarized on and to the silicon nitride 22, thus forming the individual electrodes 16A and 16A will subsequently become the fuse electrode on 14A, with a field plate 20A both under the electrode, and surrounding it as shown in FIG. 1B. 16B will become a standard FET gate electrode, surrounded by diffusions 20B that are isolated on each side of 16B by isolation oxide, and are electrically isolated under the electrode 16B by an impurity species of the opposite type as conventionally practiced in the art. The plan view of this structure is depicted in FIG. 1B.

Implants can now be performed into the polysilicon, either masked or unmasked (masked is preferred, for control reasons). This process facilitates custom implants to the polysilicon electrodes without affecting the source/drain regions or other portions of the silicon, since they are protected by nitride 22. Implant 1 to the fuse element will be a phosphorous or arsenic implant with a concentration ranging between approximately $5 \times 10e15$ per cm2 (5E15/ cm2) and 5E16/cm2, and Implant 2 to the FET gate will be a conventional source/drain implant at a lower concentration than Implant 1. This will locally enhance the applied electric field for the fuse dielectric relative to the dielectric for the FET, enhancing the differential between the two at a given applied gate bias. Note that in general the implants can be of the same dopant and dopant type, or they may be different.

Note that the implant to form region 20A is masked from all other diffusion implants, and only opened in the region of 16A. The resultant is shown in FIG. 1B, where 20A becomes continuous around and under 16A by outdiffusion under the spacer 18. Note also that the implant to form region 20B can be carried out through a mask that may either overlap the 20A implant in FIG. 1B, or it may be carried out through a mask that exposes all of the areas in which 20A and 20B are to be formed. This latter approach assumes the preferred embodiment where the antifuse 16A is n-type gate, region 20A is n-type, and the transistor 31 is an NFET. However, if the transistor 31 is a PFET, and if the junctions 20A and 20B are of a dissimilar type (e.g. 20A is n type, and 20B is p type) then regions 20A and 20B cannot overlap as described in FIG. 1B. These junctions would be separated by a minimum isolation space 21 as shown in FIG. 1C. The connection in this case between 20A and 20B would be performed at a metal level (versus as in FIG. 1B where this connection is a junction connection). The layout of FIG. 1B is superior to the layout shown in FIG. 1C in that the physical structure will be smaller, by the nature of saving an isolation space (large enough to land a metal bridge 23), as well as saving space devoted to the two contacts from 20A and 20B that would be used to connect the junctions an upper metal level. In FIG. 1C, the increased space amounts to the width of space 21 added to the distance between 22 and 18 on both electrodes 16A and 16B, and the distance between 22 to 20A, and the distance between 22 and 20B. The embodiment shown in FIG. 1C has the main advantage of altering the fuse workfunction and junction type (for example N+ electrode 16A and P+ implant 20A) so that the built in potential during programming will be reduced by the workfunction difference of 1.1 volts, thus further enabling a lowered programming voltage.

Figure 5:
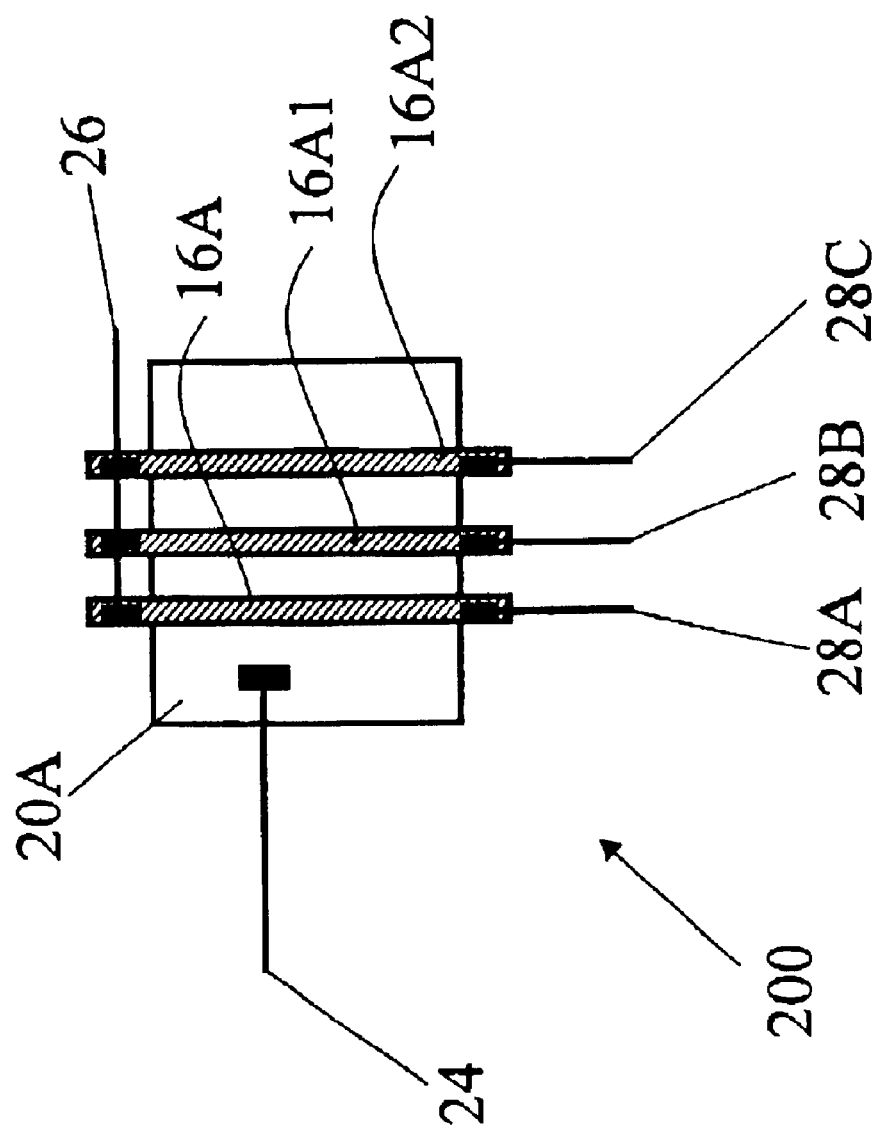
FIG. 5 is a top view of the composite antifuse element in accordance with a preferred embodiment of the invention.

FIG. 5 is a top view of the composite antifuse element 200. Note that three antifuse gates 16A, 16A1, 16A2 are disposed parallel to one another within a region that includes the diffusion region 20A. This redundancy helps ensure proper programming—utilizing three fuse elements greatly increases the chances that at least one will have the proper combination of weak dielectric and gate doping to program correctly. The gates are each connected at one end to a respective metal line 28A–28C, and are commonly connected at the other end to a metal line 26. The region 20A receives a voltage via metal line 24. Note that while these connections are referred to as "metal lines," in practice they could be any metal, metal alloy, or doped semiconductor that can provide electrical interconnections.

Figure 6:
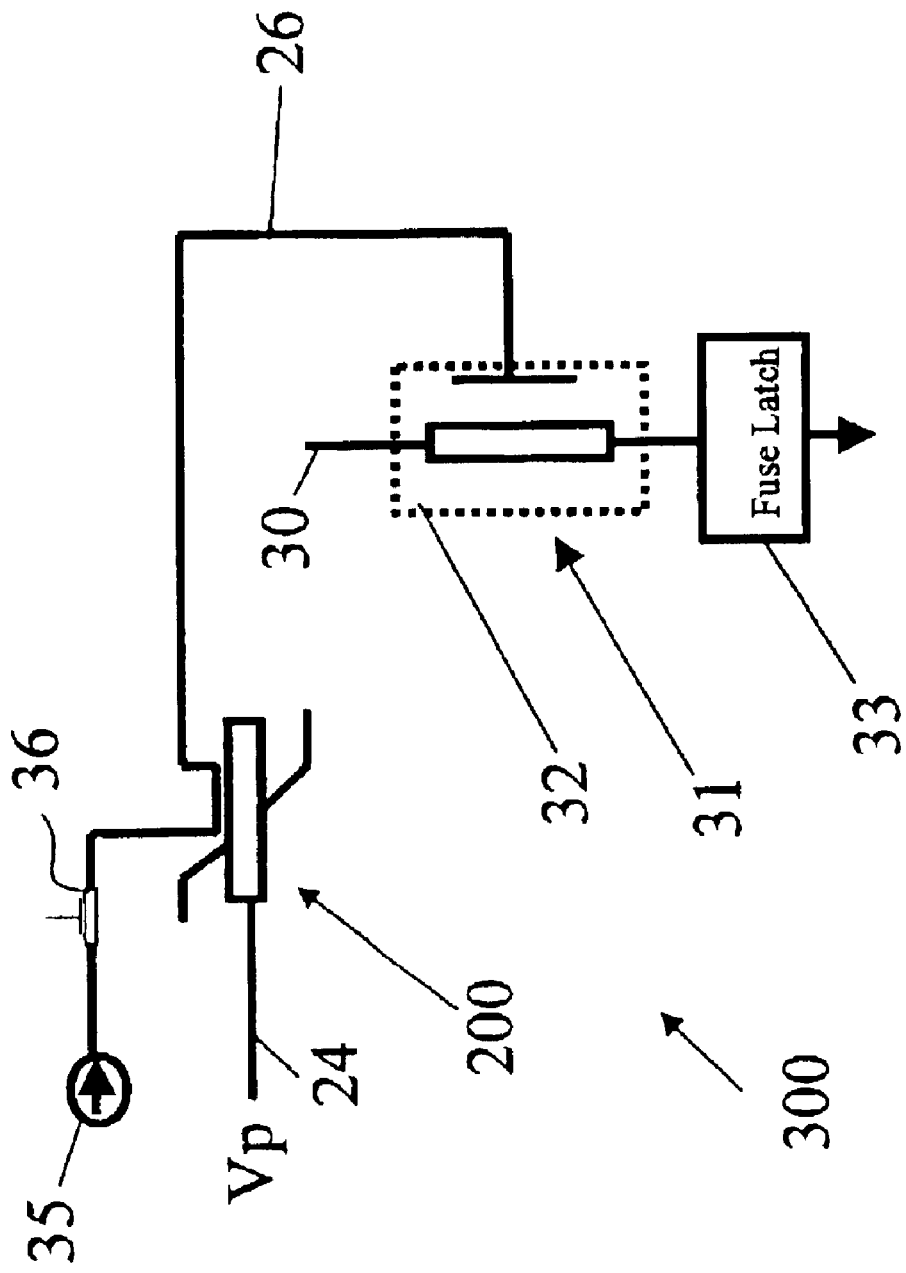
FIG. 6 is a schematic view of the antifuse circuit in accordance with a preferred of the invention, which includes the composite antifuse element shown in FIG. 5.

FIG. 6 is a schematic view of the antifuse circuit 300 which includes the fuse element 200 shown in FIG. 5. Metal line 26 of fuse element 200 is coupled to a 10 nA current source 35 that charges the fuse element 200 during a read operation through a coupling transistor 36. Metal line 24 of fuse element 200 receives a programming voltage Vp. Metal lines 28A–28C are each coupled to the output of transfer device 36 and to the gate electrode of the FET fuse read transistor 31. The transistor 31 is formed in an isolated well 32 (this well region was not shown in the other FIGS. for ease of illustration). The well doping can be controlled to calibrate the off state of the transistor. The drain electrode of the FET 31 is coupled to a voltage source 30, and the source is coupled to a current sense fuse latch 33. The latch 33 can be formed of any combination of transistors that will carry out the operations to be described below; in practice a cross coupled pair of FETS is preferred. The latch 33 is formed in the same well 32 as the transistor 31. The well doping can also be set to precisely control the latch sensitivity (i.e. the latch trip point).

As will be described in more detail below, when programmed, the antifuse element 200 drives the gate of the read transistor 31, such that the read device off-state (no Ids current) is defined as an un-programmed fuse, and a read device on-state (Ids current flow) is defined as a programmed device. Note that transistor 31 could also be configured as a NFET device, having the property of normally being on (un-programmed state), and off for a programmed device.

The operation of the antifuse circuit 300 will now be described relative to FIG. 6. Three distinct cycles will be described: read an unprogrammed fuse; program a fuse; and read a programmed fuse. It is to be understood that while two read cycles (unprogrammed and programmed) are described below, in practice a single read cycle is used, the output of which indicates the programmed state of the antifuse element 200.

A) Read un-programmed fuse:
1) Pulse fuse plate 24 to Vp=V1 (normal read voltage. This may in fact be "ground").
2) Current source 35 is enabled, charges gate of fuse latch input PFET 31.
3) Fuse read device 31 pulsed to V2, and held for the rest of the cycle.

Result: Fuse gates 16A, 16A1, 16A2 are charged, forcing the PFET 31 to an off state (i.e., a bypass path through the anti-fuse 200 does not exist in the un-programmed state).

4) Fuse Latch remains in this initialized state.

B) Program Fuse:
1) Pulse fuse plate 24 to Vp=Vdd. Note that the fuse program level for the thin dielectric is the conventional supply voltage Vdd, which is 1.5–2 volts in a 0.13 technology.
2) Transistor 36 is turned off, such that the input 26 to the fuse elements is floating.

Result: The fuse read device 31 and the current source device 36 do not break down. The Vdd voltage on diffusion 20A causes the gate oxide beneath one or more of the gates 16A, 16A1, 16A2 of the antifuse 200 to break down, producing a low resistance path at the inputs 28A–28C to the antifuse 200. Note that during this time transistor 31 is turned on, causing latch 33 to change state. Thus, a feature of the invention is that programming can be monitored by monitoring the state of latch 33 during program time; if latch 33 changes state, the antifuse element 200 was properly programmed.

C) Read a Programmed Fuse:
1) Pulse fuse plate 24 to Vp=V1
2) Current source 35 is enabled, and begins to charge the gate of fuse latch input PFET 31. However, the current path to gate 34 is shunted directly by the programmed fuse element 200. As a result, fuse latch PMOS transistor 31 turns on. The fuse latch 33 is now changed to a state opposite that of the unprogrammed initialized state.

Result: The fuse latch 33 is coupled to the fuse programming device 200 via a high impedance network, and the sensing is transformed from a traditional voltage sense means across the fuse element to a current sense having amplification via latch fuse latch PMOS transistor 31.

In the above description, fuse read transistor 31 operates as a switch where a programmed or unprogrammed fuse modulates the gate overdrive enough to turn on or cut off transistor 31 completely. In an alternate embodiment, read transistor 31 can be biased as an amplifier with a first source-drain current dependent on an unprogrammed fuse impedance, and a second source-drain current resulting from a change in fuse resistance after programming. With read transistor 31 biased as an amplifier, fuse state can be read as a change in voltage on, or a change in current through, its drain.

As set forth above, the antifuse of the invention relies on low programming voltages to set the state of the fuse, due to gate doping and selective gate oxide degradation. An antifuse circuit has been taught that sets a latch as a function of the state of a transistor that operates as a switch or an amplifier, such that the programmed state can be reliably read independent of the actual fuse programmed resistance.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A programmable element, comprising:
   a first device on a substrate having a first electrode and a first insulator disposed between the substrate and said first electrode, said first insulator having a first value of a given parameter;
   a second gain device having an FET on a substrate having a second electrode and a second insulator disposed between the substrate and said second electrode;
   said second insulator having a second value of said given parameter that is different from said first value;
   wherein said first and second electrodes of said first and second devices are coupled to one another on a continuous layer; and
   a source of programming energy coupled to said first device and causing it to permanently decrease in resistivity and not effecting the second device or the second insulator,
   wherein a programmed state of said first device is indicated by a conductive state of said second device.

2. The programmable element of claim 1, wherein said given parameter is selected from the group consisting of density, thickness, and insulative value.

3. The programmable element of claim 2, wherein said first insulator has a dielectric breakdown voltage that is less than that of said second insulator.

4. The programmable element of claim 3, wherein said first insulator is selected from the group consisting of silicon oxide, silicon nitride, silicon oxynitride, or combinations of two or more of silicon oxide, silicon nitride, and silicon oxynitride.

5. The programmable element of claim 3, wherein said first device further comprises a third electrode disposed on the substrate adjacent said insulator of said first device.

6. The programmable element of claim 5, wherein said third electrode comprises a diffusion region.

7. The programmable element of claim 6, wherein said source of programming energy comprises a voltage source.

8. The programmable element of claim 5, wherein said source of programming energy is coupled to said third electrode.

9. A programmable element, comprising:
   a first device on a substrate having a first electrode and a first insulator disposed between the substrate and said first electrode, said first insulator having a first value of a given parameter selected from the group consisting of density, thickness, and insulative value, that has a dielectric breakdown voltage that is less than that of a second insulator;
   wherein said first device further comprises a second electrode having a diffusion region disposed on the substrate adjacent said insulator of said first device, and the first electrode has a plurality of separate conductive lines overlay the diffusion region;
   a second device on a substrate having a third electrode and the second insulator disposed between the substrate and said third electrode, said second insulator having a second value of said given parameter that is different from said first value;
   wherein said first and third electrodes of said first and second devices are coupled to one another; and
   a source of programming energy coupled to said first device and causing it to permanently decrease in resistivity,
   wherein a programmed state of said first device is indicated by a conductive state of said second device.

10. A programmable element, comprising:
    a first device having an antifuse on a substrate having a first electrode and a first insulator disposed between the substrate and said first electrode, said first insulator having a first value of a given parameter selected from the group consisting of density, thickness, and insulative value;
    a second device having an FET on a substrate having a second electrode and a second insulator disposed between the substrate and said second electrode, said second insulator having a second value of said given parameter that is different from said first value;
    wherein said first and second electrodes of said first and second devices are coupled to one another; and
    a source of programming energy coupled to said first device and causing it to permanently decrease in resistivity,
    wherein a programmed state of said first device is indicated by a conductive state of said second device.

11. The programmable element of claim 10, further comprising a sense latch coupled to a controlled electrode of said FET.

12. The programmable element of claim 10, wherein said sense latch changes state when said diode is programmed.

13. The programmable element of claim 12, wherein said source of programming energy renders said first integrated circuit element permanently conductive when programmed, without rendering said second integrated circuit element permanently conductive.

14. The programmable element of claim 13, wherein said first integrated circuit element comprises a conductive electrode comprised of a plurality of separate conductive lines disposed above said diffused electrode and separated therefrom by an insulator.

15. A programmable element, comprising a programming device comprised of a first integrated circuit element having a first dielectric breakdown voltage and a MOSFET gain device comprised of a second integrated circuit element having a second dielectric breakdown voltage higher than said first dielectric breakdown voltage, said first and second integrated circuit elements each having at least one electrode, said electrodes being electrically coupled together and to a source of programming energy, said second integrated circuit element conducting current when the first integrated circuit element has been programmed.

16. A programmable element, comprising a programming device comprised of a first integrated circuit element having a first dielectric breakdown voltage and a gain device comprised of a second integrated circuit element having a second dielectric breakdown voltage higher than said first dielectric breakdown voltage, said first and second integrated circuit elements each having at least one electrode, said electrodes being electrically coupled together and to a source of programming energy wherein said first integrated circuit element comprises a diffused electrode that is coupled to said source of programming energy and said second integrated circuit element conducting current when the first integrated circuit element has been programmed.

17. The programmable element of claim 16, wherein said first integrated circuit element comprises an antifuse and said second integrated circuit element comprises an FET.

* * * * *